United States Patent
Chen

(10) Patent No.: US 12,079,928 B2
(45) Date of Patent: Sep. 3, 2024

(54) ANALYSING METHOD FOR GRATINGS, ELECTRONIC DEVICE, AND COMPUTER READABLE STORAGE MEDIUM

(71) Applicant: HTC Corporation, Taoyuan (TW)

(72) Inventor: Chih-Ying Chen, Taoyuan (TW)

(73) Assignee: HTC Corporation, Taoyuan (TW)

( * ) Notice: Subject to any disclaimer, the term of this patent is extended or adjusted under 35 U.S.C. 154(b) by 157 days.

(21) Appl. No.: 17/968,787

(22) Filed: Oct. 18, 2022

(65) Prior Publication Data
US 2023/0386129 A1  Nov. 30, 2023

Related U.S. Application Data

(60) Provisional application No. 63/346,328, filed on May 27, 2022.

(51) Int. Cl.
*G06T 15/50* (2011.01)
*G06T 7/90* (2017.01)
(Continued)

(52) U.S. Cl.
CPC .............. *G06T 15/506* (2013.01); *G06T 7/90* (2017.01); *G06T 15/04* (2013.01); *G06T 15/08* (2013.01);
(Continued)

(58) Field of Classification Search
CPC ......... G06T 15/506; G06T 7/90; G06T 15/04; G06T 15/08; G06T 2207/10024; G06T 2215/12
See application file for complete search history.

(56) References Cited

U.S. PATENT DOCUMENTS 5,889,599 A * 3/1999 Takemori ................. G03H 1/22
359/33
2002/0101587 A1 * 8/2002 Wilson ................... G01J 3/0208
359/570
(Continued)

OTHER PUBLICATIONS

Park, Jong-Il, "Multispectral Imaging Using Multiplexed Illumination," 2007 IEEE 11th International Conference on Computer Vision, Oct. 2007, pp. 1-8. (Year: 2007).*
(Continued)

*Primary Examiner* — Terrell M Robinson
(74) *Attorney, Agent, or Firm* — JCIPRNET

(57) ABSTRACT

The embodiments of the disclosure provide an analysing method for gratings, an electronic device, and a computer readable storage medium. The method includes: determining candidate gratings; determining grating combinations based on the candidate gratings, wherein each of the grating combinations includes at least one of the candidate gratings, and the at least one of the candidate gratings in each grating combination is different from each other; determining a first diffraction response map of a first multiplexing grating corresponding to a first grating combination of the grating combinations; determining a first luminous intensity map of the first multiplexing grating corresponding to the first grating combination via modifying the first diffraction response map based on at least one parameter of a light engine; and determining a first reconstruction image corresponding to the light engine via processing a template image based on the first luminous intensity map.

20 Claims, 14 Drawing Sheets
(7 of 14 Drawing Sheet(s) Filed in Color)

(51) Int. Cl.
*G06T 15/04* (2011.01)
*G06T 15/08* (2011.01)

(52) U.S. Cl.
CPC .................. *G06T 2207/10024* (2013.01);
*G06T 2215/12* (2013.01)

(56) References Cited

U.S. PATENT DOCUMENTS

| | | | | |
|---|---|---|---|---|
| 2006/0228073 | A1* | 10/2006 | Mukawa | G02B 5/18 |
| | | | | 385/31 |
| 2008/0198431 | A1* | 8/2008 | Schwerdtner | G03H 1/2294 |
| | | | | 359/32 |
| 2014/0348426 | A1* | 11/2014 | Gish | G06T 7/90 |
| | | | | 382/167 |
| 2015/0212488 | A1* | 7/2015 | Rosen | G03H 1/08 |
| | | | | 359/9 |
| 2019/0072899 | A1* | 3/2019 | Kim | G03H 1/2294 |
| 2021/0293714 | A1* | 9/2021 | Matoba | G02B 21/16 |

OTHER PUBLICATIONS

Xing, Fangjian, "Ultrafast Surface Imaging With an Increased Spatial Resolution Based on Polarization-Division Multiplexing," Jan. 2015, pp. 396-402 (Year: 2015).*

* cited by examiner

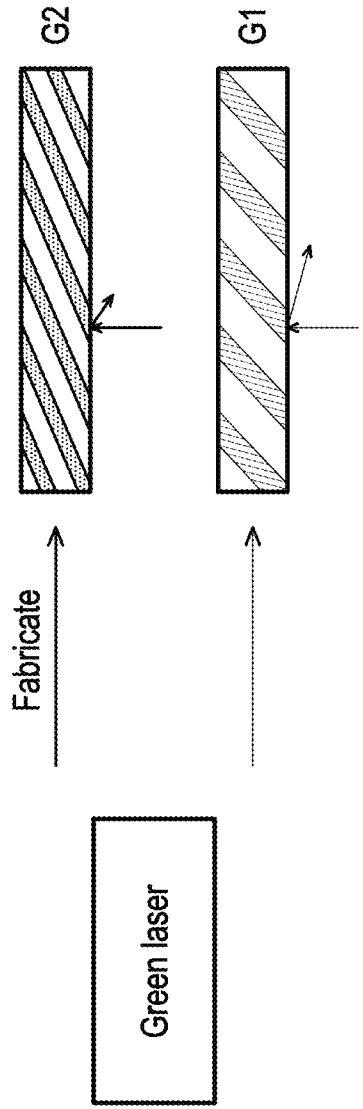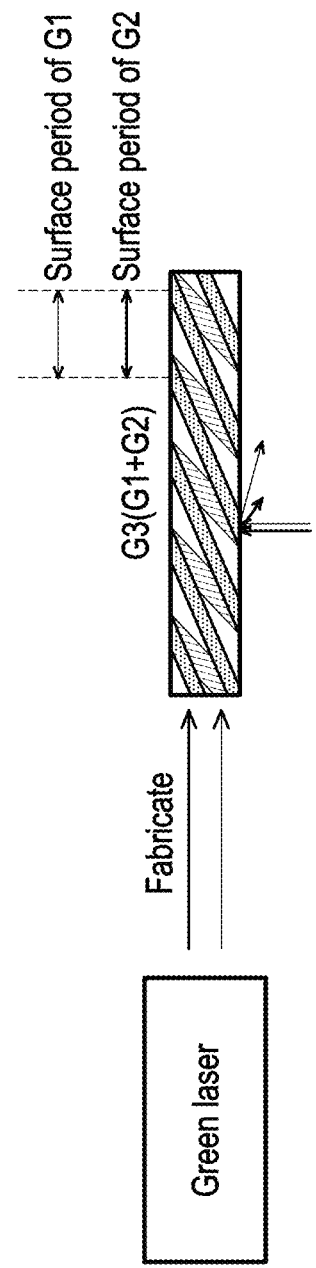
FIG. 2A
FIG. 2B

ANALYSING METHOD FOR GRATINGS, ELECTRONIC DEVICE, AND COMPUTER READABLE STORAGE MEDIUM

CROSS-REFERENCE TO RELATED APPLICATION

This application claims the priority benefit of U.S. provisional application Ser. No. 63/346,328, filed on May 27, 2022. The entirety of the above-mentioned patent application is hereby incorporated by reference herein and made a part of this specification.

BACKGROUND

1. Field of the Invention

The present disclosure generally relates to an analysing method for gratings, an electronic device, and a computer readable storage medium.

2. Description of Related Art

See FIG. 1, which shows a schematic diagram of a volume holographic grating (VHG). The VHG possess periodic fringes of refractive index modulation. Since the grating in FIG. 1 is capable of diffracting lights, the existing VHG design and analysis mainly aims to develop an algorithm based on Kogelnik's coupled wave theory to calculate the diffraction behavior (e.g., diffraction efficiency, diffraction angle, etc.) of a single grating.

Nowadays, the existing technology allows multiple VHGs to be implemented simultaneously on one material to form a single holographic optical element (HOE) to achieve more various and complicated diffraction behaviors, and this technology is called multiplexing grating.

See FIG. 2A and FIG. 2B, wherein FIG. 2A shows a schematic diagram of fabricating a VHG, and FIG. 2B shows a schematic diagram of fabricating a multiplexing grating. In FIG. 2A, a green laser can be used to fabricate two different VHGs, VHG G1 and VGH G2, with two different recording conditions on two different pieces of materials, such that the VHG G1 and G2 can be used to diffract lights with different diffraction behaviors.

In FIG. 2B, the green laser can be used to fabricate one material with two different recording laser conditions for producing the multiplexing grating G3 (which can be understood as a combination of VHG G1 and VHG G2). In the embodiment, the surface period of the VHG G1 is the projected spacing between two adjacent bright fringes in the plane of the VHG G1, and the surface period of the VHG G2 is the projected spacing between two adjacent bright fringes in the plane of the VHG G2, wherein the surface periods of the VHG G1 and VHG G2 can be the same in FIG. 2B. In other embodiments, the surface periods of the VHG G1 and VHG G2 can be different, but the disclosure is not limited thereto.

See FIG. 3, which shows an application scenario of the gratings. In FIG. 3, the scenario is assumed to be the light propagation mechanism designed in augmented reality (AR) glasses. Specifically, a light engine can be used to emit lights to an input HOE (which can be implemented by using the VHG and/or the multiplexing grating), and the lights diffracted by the input HOE can be propagated to an output HOE (which can be implemented by using the VHG and/or the multiplexing grating) via a waveguide (WG). Afterwards, the output HOE can diffract the lights received from the WG outwardly for the user to see the corresponding AR content.

For providing better performance when using the multiplexing gratings, the diffraction behaviors thereof need to be analyzed. However, since the Kogelnik model can only be used to analyze a single grating, the Kogelnik model is not sufficient to describe the behavior of the multiplexing gratings.

A common solution is to use an algorithm to convert the simulation of the multiplexing grating into separate single gratings, and then obtain the calculation result of each single grating in a sequential way and superimpose these calculation results. Although this algorithm can obtain simulation results in line with experiments, it is mainly used for optical analysis, and its application is limited.

When simulating optical designs, it is necessary to find the optimal solution by scanning different variable combinations. As for finding the optimal solution for the multiplexing grating by using the above sequential way, all the possible gratings (referred to as candidate gratings hereinafter) and the corresponding multiplexing order (i.e., the number of VHGs fabricated on the same material) needs to be considered to design the corresponding number of nested loop for simulating different pairings/permutations of the candidate gratings.

If the number of candidate gratings is n, and the multiplexing order is m, then $n^m$ permutations of the gratings need to be calculated, and the calculation complexity increases exponentially with the increase of m and n. In addition, since the repeated multiplexing permutations of the candidate gratings cannot be screened out, it will cause a waste of computing resources. Further, the permutations of candidate gratings corresponding to different multiplexing orders may be improperly compared in the process of finding optimal solution. Besides, the multiplexing order needs to be determined in advance and cannot be designed as a variable when finding the optimal solution. Accordingly, the above sequential way has limited scalability and is not suitable for optical design due to its specific application and high computation complexity.

SUMMARY OF THE INVENTION

Accordingly, the disclosure is directed to an analysing method for gratings, an electronic device, and a computer readable storage medium, which may be used to solve the above technical problems.

The embodiments of the disclosure provide an analysing method for gratings, adapted to an electronic device, comprising: determining a plurality of candidate gratings; determining a plurality of grating combinations based on the candidate gratings, wherein each of the grating combinations includes at least one of the candidate gratings, and the at least one of the candidate gratings in each grating combination is different from each other; determining a first diffraction response map of a first multiplexing grating corresponding to a first grating combination of the grating combinations; determining a first luminous intensity map of the first multiplexing grating corresponding to the first grating combination via modifying the first diffraction response map based on at least one parameter of a light engine; and determining a first reconstruction image corresponding to the light engine via processing a template image based on the first luminous intensity map.

The embodiments of the disclosure provide an electronic device including a storage circuit and a processor. The storage circuit stores a program code. The processor is coupled to the non-transitory storage circuit and accesses the program code to perform: determining a plurality of candidate gratings; determining a plurality of grating combinations based on the candidate gratings, wherein each of the grating combinations includes at least one of the candidate gratings, and the at least one of the candidate gratings in each grating combination is different from each other; determining a first diffraction response map of a first multiplexing grating corresponding to a first grating combination of the grating combinations; determining a first luminous intensity map of the first multiplexing grating corresponding to the first grating combination via modifying the first diffraction response map based on at least one parameter of a light engine; and determining a first reconstruction image corresponding to the light engine via processing a template image based on the first luminous intensity map.

The embodiments of the disclosure provide a non-transitory computer readable storage medium, the computer readable storage medium recording an executable computer program, the executable computer program being loaded by a host to perform steps of: determining a plurality of candidate gratings; determining a plurality of grating combinations based on the candidate gratings, wherein each of the grating combinations includes at least one of the candidate gratings, and the at least one of the candidate gratings in each grating combination is different from each other; determining a first diffraction response map of a first multiplexing grating corresponding to a first grating combination of the grating combinations; determining a first luminous intensity map of the first multiplexing grating corresponding to the first grating combination via modifying the first diffraction response map based on at least one parameter of a light engine; and determining a first reconstruction image corresponding to the light engine via processing a template image based on the first luminous intensity map.

BRIEF DESCRIPTION OF THE DRAWINGS

The invention contains at least one color photograph. Copies of the disclosure publication with the color photographs will be provided by the Patent & Trademark Office upon request and payment of the necessary fee.

The accompanying drawings are included to provide a further understanding of the invention, and are incorporated in and constitute a part of this specification. The drawings illustrate embodiments of the invention and, together with the description, serve to explain the principles of the disclosure.

FIG. 2A shows a schematic diagram of fabricating a VHG, and FIG. 2B shows a schematic diagram of fabricating a multiplexing grating.

DESCRIPTION OF THE EMBODIMENTS

Figure 1:
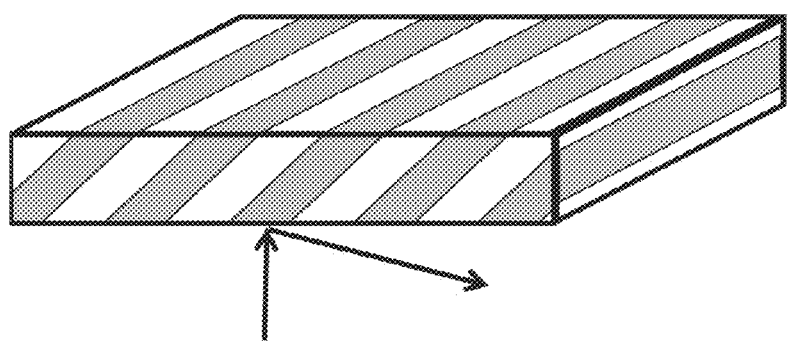
FIG. 1 shows a schematic diagram of a volume holographic grating (VHG).

Reference will now be made in detail to the present preferred embodiments of the invention, examples of which are illustrated in the accompanying drawings. Wherever possible, the same reference numbers are used in the drawings and the description to refer to the same or like parts.

Figure 4:
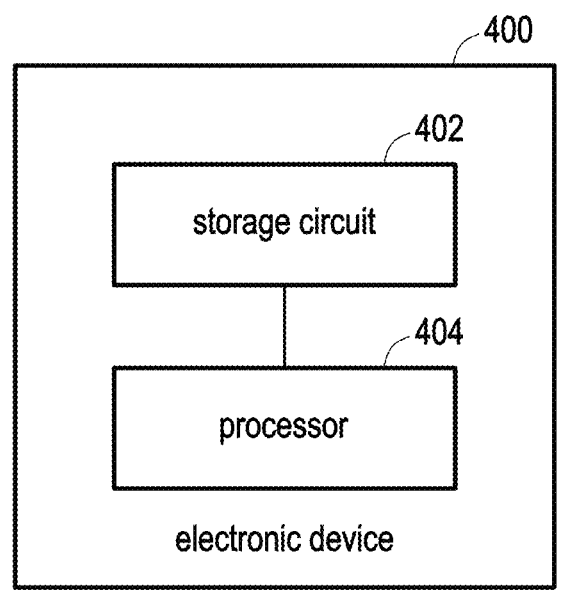
FIG. 4 shows a functional diagram of an electronic device according to an embodiment of the disclosure.

See FIG. 4, which shows a functional diagram of an electronic device according to an embodiment of the disclosure. In various embodiments, the electronic device 400 can be implemented as any smart device and/or computer device, but the disclosure is not limited thereto.

In FIG. 4, the electronic device 400 includes a storage circuit 402 and a processor 404. The storage circuit 402 is one or a combination of a stationary or mobile random access memory (RAM), read-only memory (ROM), flash memory, hard disk, or any other similar device, and which records a plurality of modules and/or program codes that can be executed by the processor 404.

The processor 404 may be coupled with the storage circuit 402, and the processor 404 may be, for example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Array (FPGAs) circuits, any other type of integrated circuit (IC), a state machine, and the like.

In the embodiments of the disclosure, the processor 404 may access the modules and/or program codes stored in the storage circuit 402 to implement the analysing method for gratings provided in the disclosure, which would be further discussed in the following.

Figure 5:
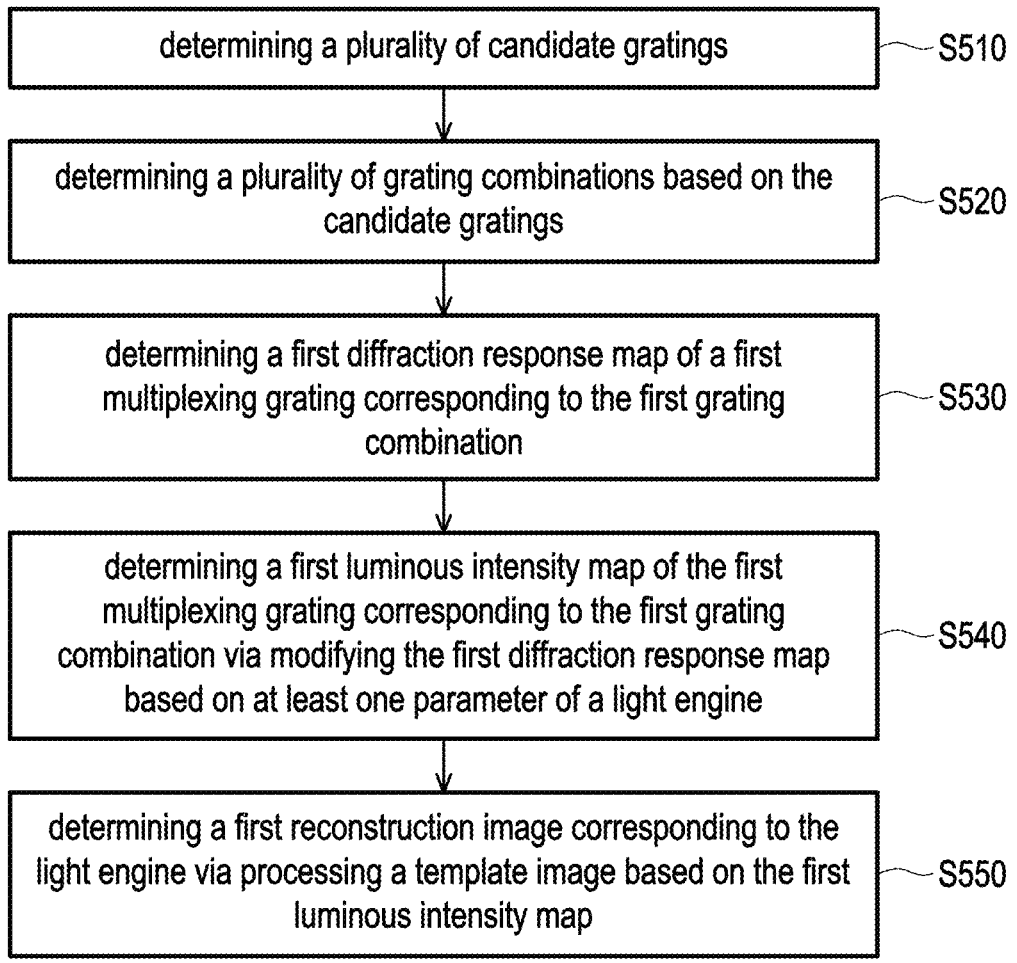
FIG. 5 shows a flow chart of the analysing method for gratings according to an embodiment of the disclosure.

See FIG. 5, which shows a flow chart of the analysing method for gratings according to an embodiment of the disclosure. The method of this embodiment may be executed by the electronic device 400 in FIG. 4, and the details of each step in FIG. 5 will be described below with the components shown in FIG. 4.

In step S510, the processor 404 determines a plurality of candidate gratings. In one embodiment, the processor 404 can regard any grating (e.g., VHG) preferred by the designer as the candidate grating. In other embodiments, the processor 404 can perform a particular mechanism to determine the considered candidate gratings, and the details thereof would be introduced later with FIG. 10.

In step S520, the processor 404 determines a plurality of grating combinations based on the candidate gratings, wherein each of the grating combinations includes at least one of the candidate gratings, and the at least one of the candidate gratings in each grating combination is different from each other. In one embodiment, the grating combinations are different from each other.

In one embodiment, in the case where the number of the considered candidate gratings is n and the multiplexing order is m (n, m are positive integers), the processor 404 may accordingly determine n groups of grating combinations. In one embodiment, a j-th (j ranges from 1 to m) group of the grating combinations may include C grating combinations, each grating combination in the j-th group includes m of the candidate gratings, and the j candidate gratings in the same grating combination are different from each other. For better explaining the concept of the disclosure, FIG. 6A would be used as an example.

Figure 6A:
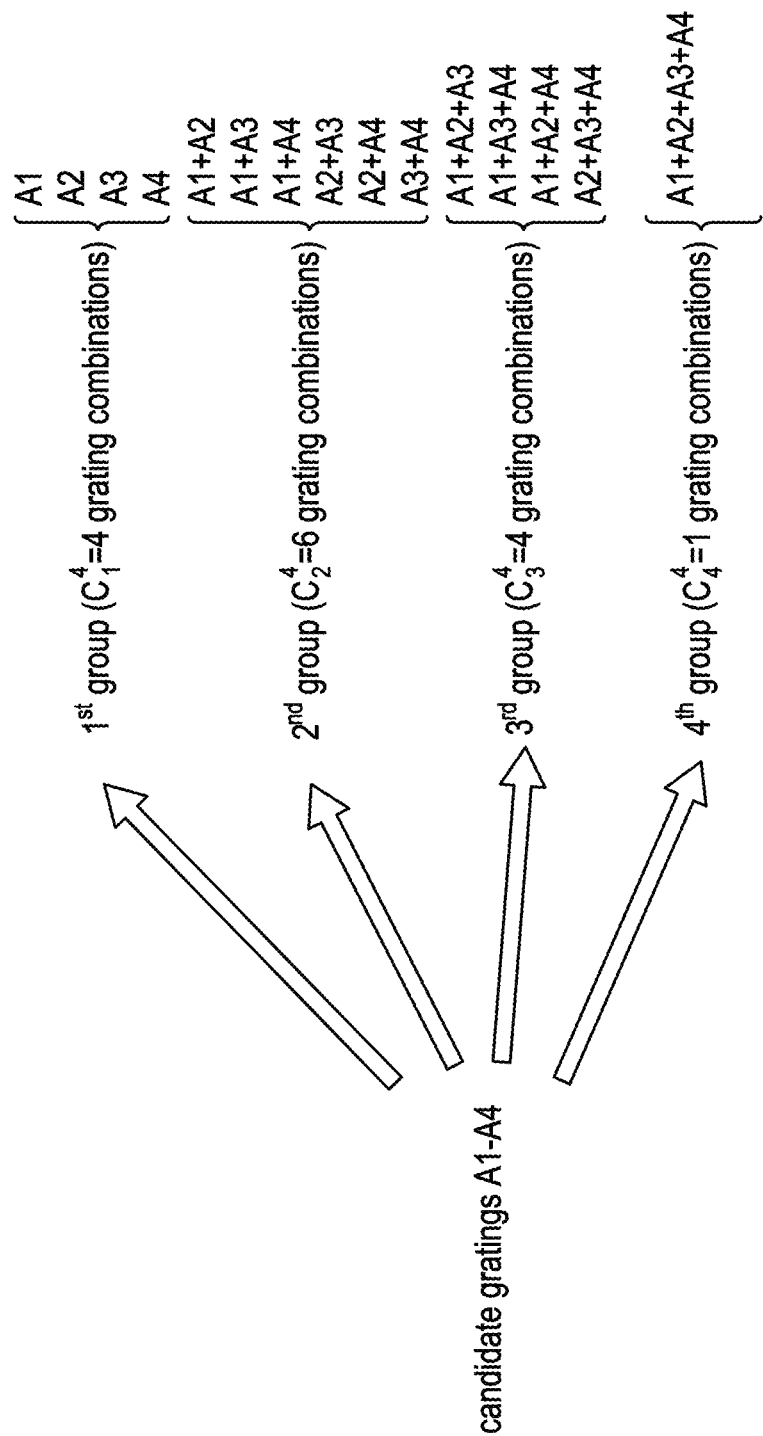
FIG. 6A shows a schematic diagram of the grating combinations according to an embodiment of the disclosure.

See FIG. 6A, which shows a schematic diagram of the grating combinations according to an embodiment of the disclosure. In FIG. 6A it is assumed that the considered candidate gratings include candidate gratings A1-A4 and the multiplexing order is 4 (i.e., n and m are both 4). Since each grating combination needs to include at least one of the candidate gratings A1-A4 and the candidate gratings in each grating combination need to be different from each other, the processor 404 may determine 4 groups of grating combinations.

In FIG. 6A, the $1^{st}$ (i.e., j=1) group includes 4 (i.e., $C_1^4$) grating combinations, wherein each grating combination in the $1^{st}$ group includes one of the candidate gratings A1-A4. The $2^{nd}$ (i.e., j=2) group includes 6 (i.e., $C_2^4$) grating combinations, wherein each grating combination in the $2^{nd}$ group includes two of the candidate gratings A1-A4. The $3^{rd}$ (i.e., j=3) group includes 4 (i.e., $C_3$) grating combinations, wherein each grating combination in the $3^{rd}$ group includes three of the candidate gratings A1-A4. The $4^{th}$ (i.e., j=4) group includes 1 (i.e., $C_4^4$) grating combination, wherein each grating combination in the $4^{th}$ group includes four of the candidate gratings A1-A4.

Accordingly, in the assumption used in FIG. 6A, the processor 404 only needs to further analyse 15 (i.e., $C_1^4 + C_2^4 + C_3^4 + C_4^4$) grating combinations, which reduces the computation complexity and saves the computation resources of the processor 404.

More specifically, if the scenario in FIG. 6A (i.e., n and m are 4) is analysed by using the conventional sequential way, the candidate gratings A1-A4 would be used to determine n groups of grating permutations. In this case, a j-th group of the grating permutations would include $n^j$ grating permutations.

For example, the $1^{st}$ (i.e., j=1) group of the grating permutation may include four (i.e., $4^1$) grating permutations, and each grating permutation include one of the candidate gratings A1-A4; the $2^{nd}$ (i.e., j=2) group of the grating permutation may include sixteen (i.e., $4^2$) grating permutations, and each grating permutation include two candidate grating; the $3^{rd}$ (i.e., j=3) group of the grating permutation may include 64 (i.e., $4^3$) grating permutations, and each grating permutation include three candidate gratings; the $4^{th}$ (i.e., j=4) group of the grating permutation may include 256 (i.e., $4^4$) grating permutations, and each grating permutation include four candidate gratings. That is, the total number of the grating permutations would be 340 (i.e., $\Sigma_{m=1}^n n^m$).

In the assumption of using the conventional sequential way, each candidate grating in the same grating permutation can be one of the candidate gratings A1-A4. That is, the candidate gratings in the same grating permutation can be repeated, and the same candidate gratings arranged in different orders would be considered as belonging to different grating permutations. In this case, the grating permutations in the $2^{nd}$ group of the grating permutation may be "A1+

A1", "A2+A2", "A3+A3", "A4+A4", "A1+A2", "A2+A1", "A2+A3", "A3+A2", "A2+A4", A4+A2", "A1+A4", "A4+A1", "A1+A3", "A3+A1", "A3+A4", "A4+A3". The grating permutations in other groups of the grating permutation can be derived, which would not be further provided.

However, repeated gratings provide the same diffraction behaviour, and the gratings would provide the same diffraction behaviour even if they are arranged in different orders. That is, some of the grating permutations (e.g., the grating permutations of "A1+A1", "A2+A2", "A3+A3", "A4+A4", "A2+A1", "A3+A2", "A4+A2", "A4+A1", "A3+A1", "A4+A3" in the $2^{nd}$ group of the grating permutation) would be unnecessarily analysed when using the conventional sequential way, which increases the computation complexity and wastes the computation resources.

In contrast, since the processor 404 can determine the grating combinations that are necessary to be further analysed in advance, and hence the computation complexity and the used computation resources can be reduced.

In the embodiments of the disclosure, the processor 404 can further analyse each of the grating combinations determined in step S520. For better understanding, the following concept of the disclosure would be introduced by using one of the grating combinations (referred to as a first grating combination) as an example, and people having ordinary skills in the art should be able to understand how the method of the disclosure is operated with respect to other grating combinations. In one embodiment, the first grating combination includes one or more first gratings of the candidate gratings, and the first gratings are different from each other.

In step S530, the processor 404 determines a first diffraction response map of a first multiplexing grating corresponding to the first grating combination. In one embodiment, the processor 404 determines the first diffraction response map of the first grating combination by analysing the first grating combination with a Kogelnik theoretical model, but the disclosure is not limited thereto. In one embodiment, the first multiplexing grating can be understood as the multiplexing grating fabricated by combining the candidate gratings in the first grating combination on the same material. In this case, the first diffraction response map of the first multiplexing grating can be understood as the diffraction response map simulated by using the Kogelnik theoretical model with respect to the first multiplexing grating, but the disclosure is not limited thereto. For better explaining the concept of the disclosure, FIG. 6B would be used as an example.

Figure 6B:
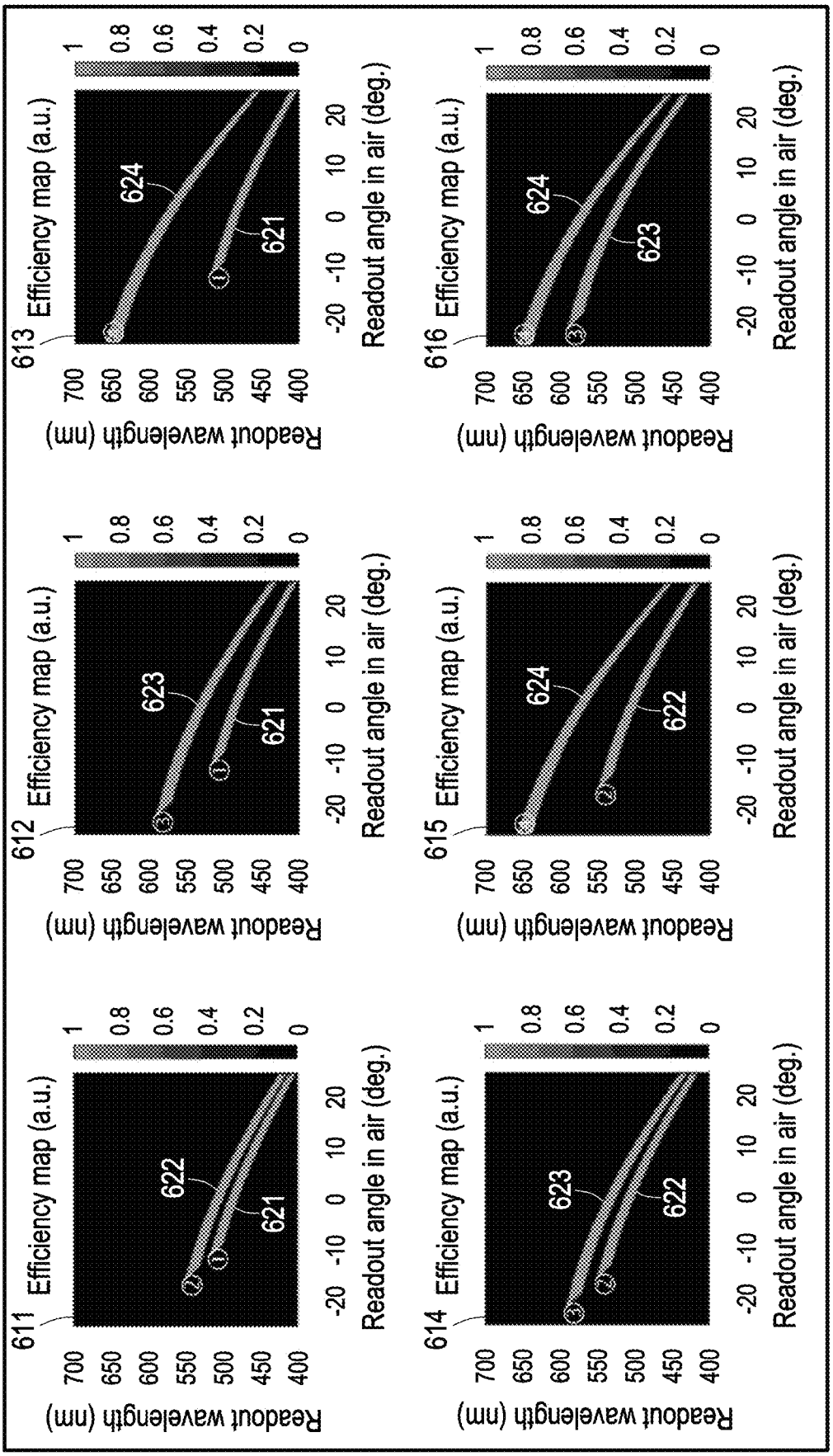
FIG. 6B shows a schematic diagram of the diffraction response maps corresponding to the grating combinations of FIG. 6A.

See FIG. 6B, which shows a schematic diagram of the diffraction response maps corresponding to the grating combinations of FIG. 6A. In FIG. 6B, the processor 404 determines the diffraction response map for each of the grating combinations in FIG. 6A. For example, for the $2^{nd}$ group of the grating combinations, the diffraction response maps 611-616 may respectively corresponds to the grating combinations of "A1+A2", "A1+A3", "A1+A4", "A2+A3", "A2+A4", "A3+A4", but the disclosure is not limited thereto.

In FIG. 6B, the curve labelled with a number of k in each diffraction response map may be the diffraction response corresponding to the candidate grating Ak. For example, the curve 621 labelled with a number of 1 in each diffraction response map (e.g., the diffraction response map 611) may be the diffraction response corresponding to the candidate grating A1, the curve 622 labelled with a number of 2 in each diffraction response map (e.g., the diffraction response map 611) may be the diffraction response corresponding to the candidate grating A2, the curve 623 labelled with a number of 3 in each diffraction response map (e.g., the diffraction response map 612) may be the diffraction response corresponding to the candidate grating A3, and the curve 624 labelled with a number of 4 in each diffraction response map (e.g., the diffraction response map 613) may be the diffraction response corresponding to the candidate grating A4, but the disclosure is not limited thereto.

In step S540, the processor 404 determining a first luminous intensity map of the first multiplexing grating corresponding to the first grating combination via modifying the first diffraction response map based on at least one parameter of a light engine.

Figure 3:
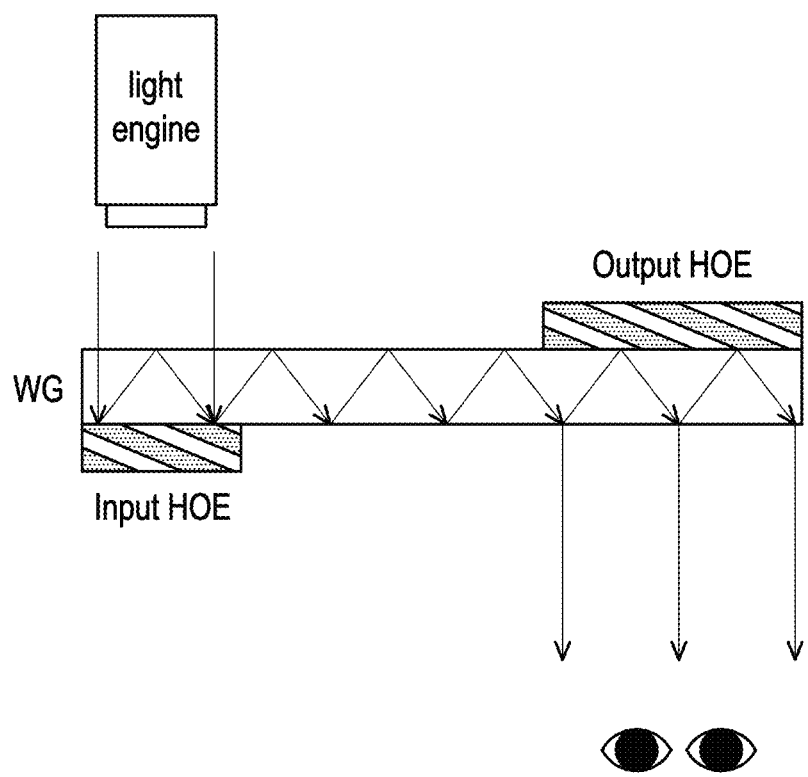
FIG. 3 shows an application scenario of the gratings.

In one embodiment, the light engine can be assumed to be used with the first multiplexing grating in, for example, the same display device (e.g., an AR device such as the AR glasses), but the disclosure is not limited thereto. In one embodiment, the AR device can include elements such as input/output HOEs (which can be implemented by using the first multiplexing grating), WG as exemplarily shown in FIG. 3, but the disclosure is not limited thereto.

In different embodiments, the parameter of the light engine can include a first optical spectrums associated with a first color channel. In this case, the processor 404 can determine a luminous flux map via performing a unit conversion to the first optical spectrum; determine a first luminous intensity mask associated with the first color channel via performing an angular expansion to the luminous flux map; and determine the first luminous intensity map of the first multiplexing grating corresponding to the first grating combination via combining the first luminous intensity mask with the first diffraction response map. For better understanding, FIG. 7A would be used as an example for explanation.

Figure 7A:
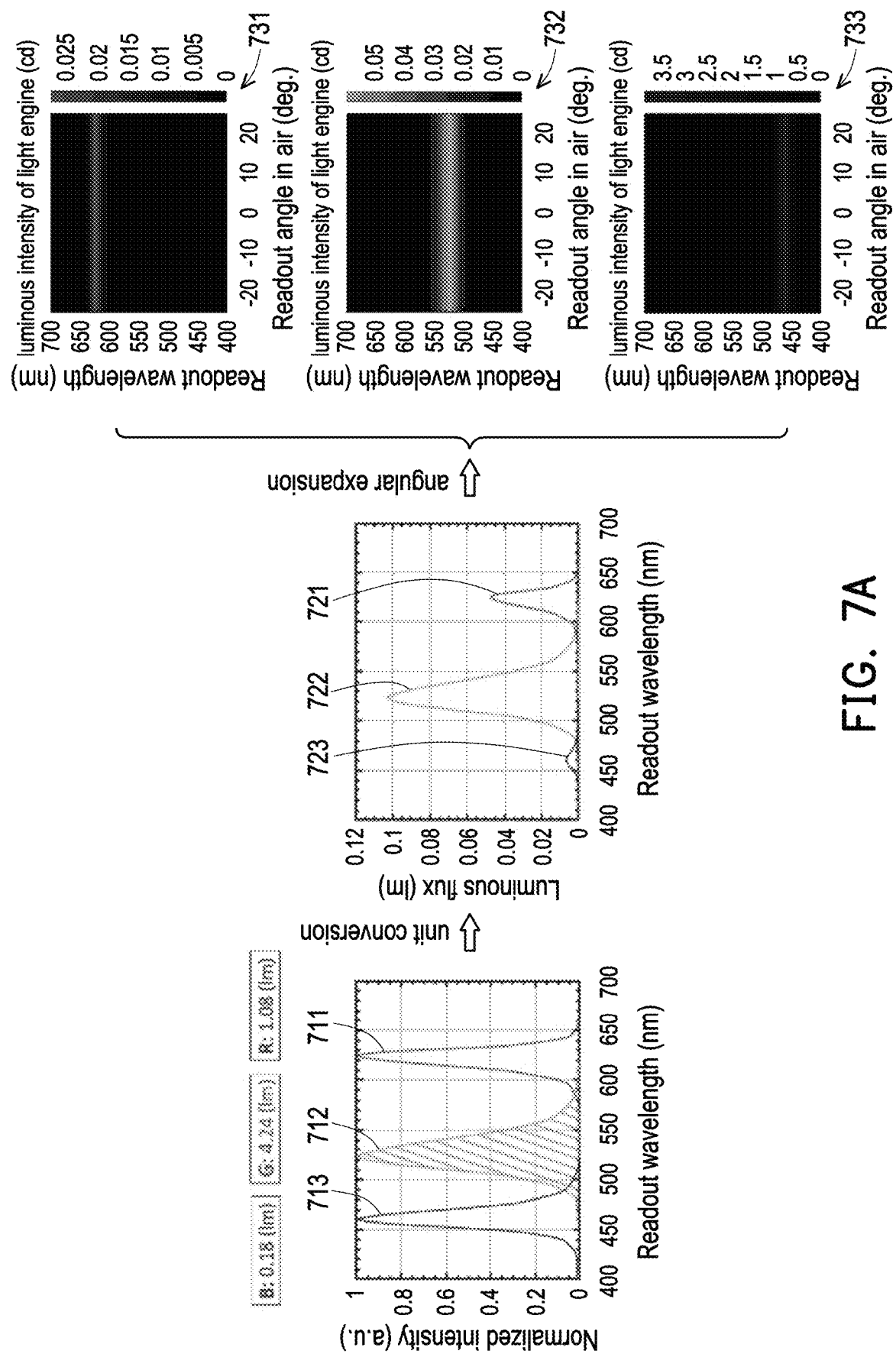
FIG. 7A shows a schematic diagram of determining the first luminous intensity mask according to an embodiment of the disclosure.

See FIG. 7A, which shows a schematic diagram of determining the first luminous intensity mask according to an embodiment of the disclosure. In FIG. 7A, the processor 404 may obtain the optical spectrums 711-713 of the light engine, wherein the optical spectrums 711-713 may respectively correspond to the color channels of Red, Green, and Blue.

In one embodiment, the processor 404 determines luminous flux map 721-723 respectively corresponding to the optical spectrum 711-713 via performing a unit conversion to each optical spectrum 711-713. Since the optical spectrums 711-713 are represented by the normalized intensity, the unit conversion can be used to characterize the optical spectrums 711-713 in a unit of Lumens, i.e., the luminous flux map 721-723, but the disclosure is not limited thereto. The details of the unit conversion can be referred to any related existing documents, which would not be further discussed.

In one embodiment, the processor 404 determining luminous intensity masks 731-733 associated with the color channels via performing an angular expansion to each of the luminous flux map 721-723, wherein the luminous flux map 721-723 respectively corresponds to Red, Green, and Blue. In the embodiment, the details of the angular expansion can be referred to any related existing documents, which would not be further discussed.

In one embodiment, the processor 404 may regard one of the luminous intensity masks 731-733 as the considered first luminous intensity mask and determine the first luminous intensity map of the first multiplexing grating corresponding to the first grating combination via combining the first luminous intensity mask with the first diffraction response map.

Figure 7B:
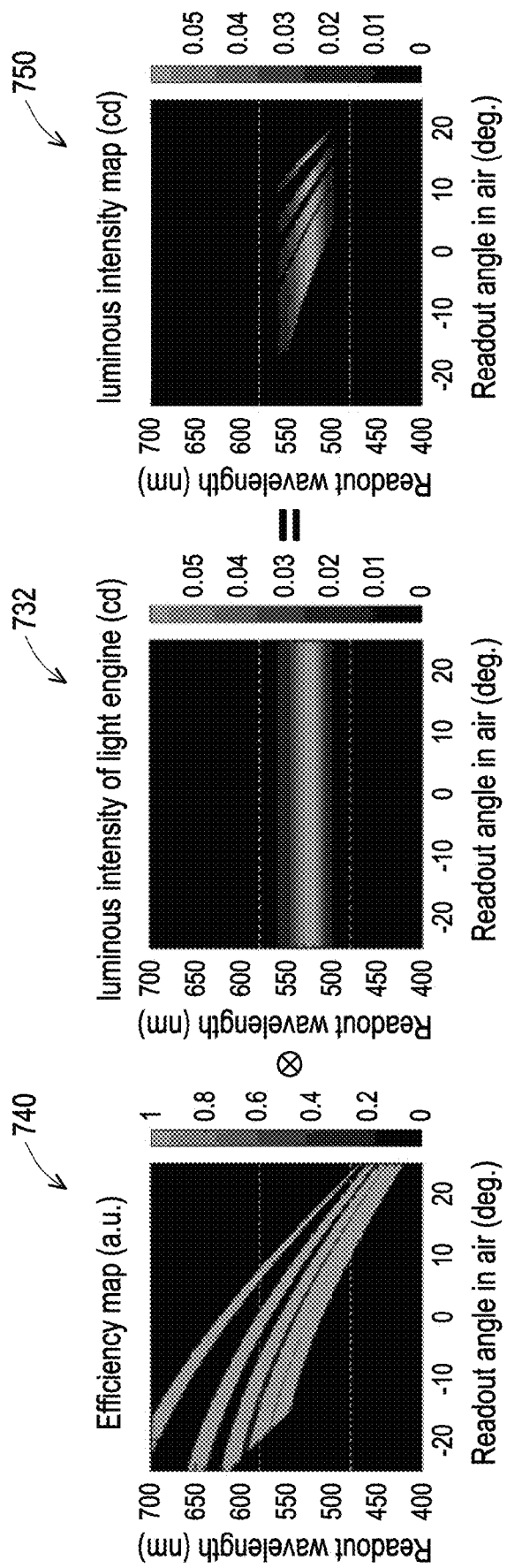
FIG. 7B shows a schematic of combining the first luminous intensity mask with the first diffraction response map according to FIG. 7A.

See FIG. 7B, which shows a schematic of combining the first luminous intensity mask with the first diffraction response map according to FIG. 7A. In FIG. 7B, assuming that the considered first diffraction response map is the diffraction response map 740 and the considered first luminous intensity mask is the luminous intensity mask 732 corresponding to Green. In this case, the processor 404 can combine the diffraction response map 740 with the luminous intensity mask 732 to generate the luminous intensity map 750 as the first luminous intensity map of the first multiplexing grating corresponding to the first grating combination.

In one embodiment, the processor 404 can multiply the first luminous intensity mask (i.e., the luminous intensity mask 732) with the first diffraction response map (i.e., the diffraction response map 740) in a pointwise way to generate the luminous intensity map 750, but the disclosure is not limited thereto.

As can be seen from FIG. 7B, since the luminous intensity mask 732 has a wavelength range R1 (which roughly ranges from 480 nm to 580 nm), the region corresponding to the wavelength range R1 of the luminous intensity mask 732 in the diffraction response map 740 would be extracted to form the luminous intensity map 750, wherein the intensity distribution of the extracted part of the diffraction response map 740 would be accordingly determined based on the intensity distribution of the luminous intensity mask 732. For example, the variation trend of the luminous intensity in the wavelength range R1 of the luminous intensity mask 732 roughly corresponds to the variation trend of the luminous intensity in the wavelength range R1 of the luminous intensity map 750, but the disclosure is not limited thereto.

In step S550, the processor 404 determines a first reconstruction image corresponding to the light engine via processing a template image based on the first luminous intensity map.

In one embodiment, in the process of determining the first reconstruction image, the processor 404 can determine a first color space map based on the first luminous intensity map; determine a first luminous intensity-to-field of view map based on the first luminous intensity map; and determine the first reconstruction image via processing the template image with the first color space map and the first luminous intensity-to-field of view map.

Figure 8A:
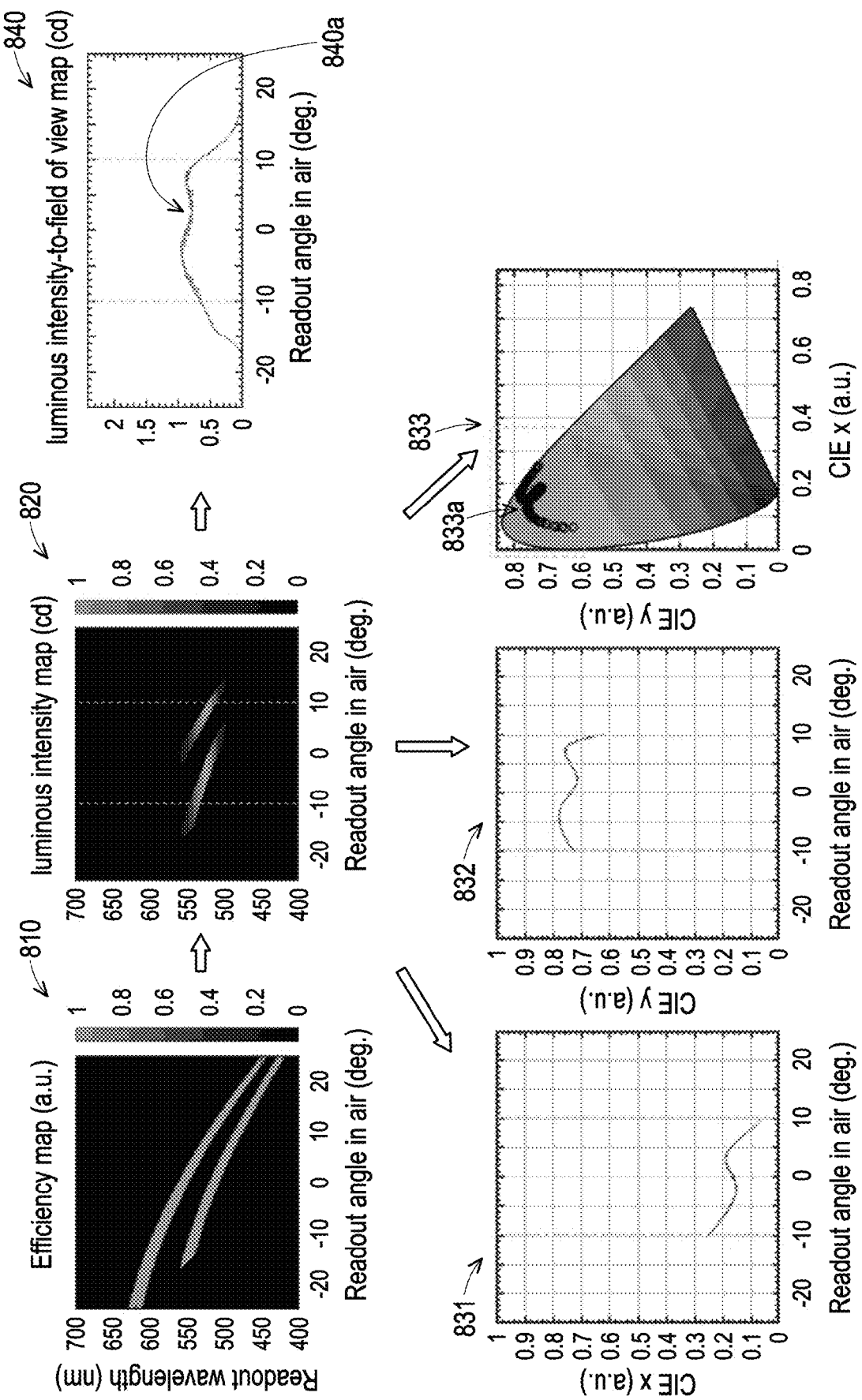
FIG. 8A and FIG. 8B show an application scenario of determining the first reconstruction image according to an embodiment of the disclosure.
Figure 8B:
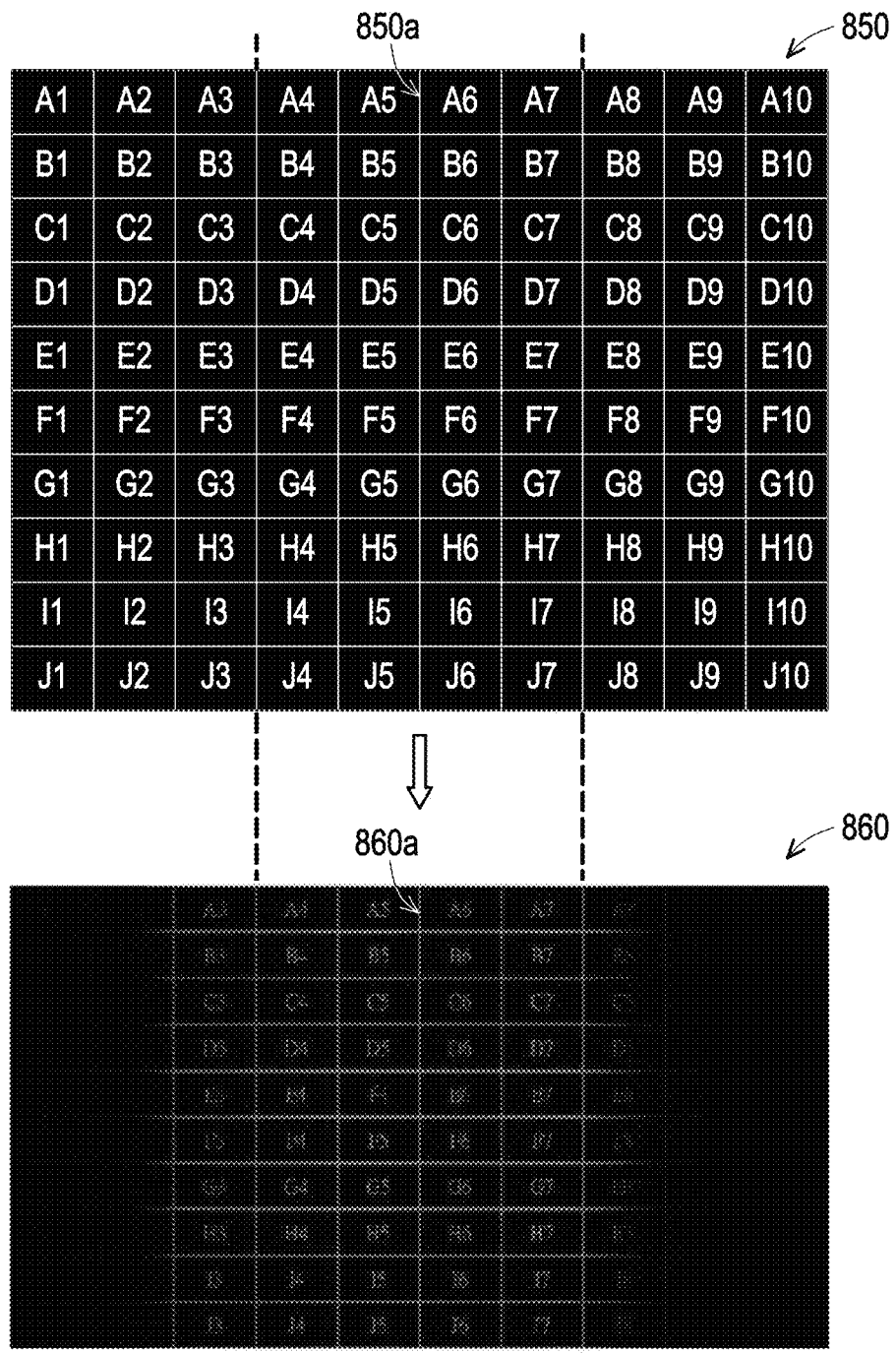

For better understanding, FIG. 8A and FIG. 8B would be used as an example for explaining. See FIG. 8A and FIG. 8B, which shows an application scenario of determining the first reconstruction image according to an embodiment of the disclosure.

In FIG. 8A and FIG. 8B, assuming that the diffraction response map 810 is the considered first diffraction response map, and the processor 404 can combine the diffraction response map 810 with the considered first luminous intensity mask (e.g., the luminous intensity mask 732) to generate the luminous intensity map 820 as the considered first luminous intensity map.

Next, the processor 404 can determine a first color space map based on the luminous intensity map 820 (i.e., the first luminous intensity map). In FIG. 8A and FIG. 8B, the first color space map may correspond to a CIExy color space and include a CIEx map 831, a CIEy map 832, and a CIExy map 833. The details of determining the CIEx map 831, the CIEy map 832, and the CIExy map 833 based on the luminous intensity map 820 can be referred to the existing documents related to the standard of CIExy, but the disclosure is not limited thereto.

In addition, the processor 404 can determine the luminous intensity-to-field of view map 840 based on the luminous intensity map 820 (i.e., the first luminous intensity map) as the first luminous intensity-to-field of view map, wherein the field of view (e.g., −25 degrees to 25 degrees) of the luminous intensity-to-field of view map 840 can correspond to the field of view provided by the AR device. The details of determining the luminous intensity-to-field of view map 840 based on the luminous intensity map 820 can be referred to the existing documents, but the disclosure is not limited thereto.

Afterwards, the processor 404 can determine the first reconstruction image 860 via processing the template image 850 with the CIEx map 831, the CIEy map 832, and the CIExy map 833 and the luminous intensity-to-field of view map 840.

In FIG. 8A and FIG. 8B, the template image 850 can be, for example, a black image (which corresponds to the field of view provided by the AR device) separated by white lines into several grids, and each grid can be designed with the corresponding labels (e.g., the white words of A1-A10, B1-B10, . . . , J1-J10). Noted that the words of A1-A10 (and B1-B10, . . . , J1-J10) in the template 850 are actual letters presented on the template image 850, which is different from the concept of the candidate gratings A1-A4.

In the embodiment, the template image 850 may be divided into 10×10 grids. Since the field of view provided by the AR device exemplarily ranges from −25 degrees to 25 degrees (i.e., 50 degrees overall), it can be known that each grid corresponds to 5 degrees (i.e., 50/10) of the field of view. For example, the grids labelled with A4' to A7' correspond to −10 degrees to 10 degrees of the field of view, and so as the grids labelled with B4 to B7, the grids labelled with C4 to C7, . . . , and the grids labelled with J4 to J7.

As can be seen in FIG. 8A and FIG. 8B, the first reconstruction image 860 also includes several grids corresponding to the grids in the template image 850. In the embodiment, the color and the luminous intensity of any image region in the first reconstruction image 860 can be determined by processing the template image 850 with the first color space map and the first luminous intensity-to-field of view map.

For better understanding, one pair of corresponding image regions in the template image 850 and the first reconstruction image 860 (e.g., the image regions corresponding to the same viewing angle in the template image 850 and the first reconstruction image 860) would be used as an example for explaining, and people having ordinary skills in the art should be able to understand how the method of the disclosure is operated with respect to other pairs of corresponding image regions.

In the embodiment, each of the first reconstruction image 860 and the template image 850 includes a first image region corresponding to a first viewing angle. In this case, in the process of processing the template image 850 with the first color space map and the first luminous intensity-to-field of view map, the processor 404 can determine a first color corresponding to the first viewing angle based on the first color space map; determine a first luminous intensity corresponding to the first viewing angle based on the first luminous intensity-to-field of view map; and determine a specific color and a specific luminous intensity of the first image region in the first reconstruction image 860 by respectively setting a color and a luminous intensity of the first image region in the template image 850 to be the first color and the first luminous intensity.

In FIG. 8A and FIG. 8B, assuming that the considered first viewing angle is 0 degree, the processor 404 may consider the line 850a (which corresponds to 0 degree of the field of view) as the first image region in the template image 850 and the line 860a (which also corresponds to 0 degree of the field of view) as the first image region in the first reconstruction image 860.

In this case, the processor 404 can obtain a CIEx value corresponding to the first viewing angle in the CIEx map 831; obtain a CIEy value corresponding to the first viewing angle in the CIEy map 832. In the embodiment where the first viewing angle is 0 degree, the processor 404 can obtain the value corresponding to 0 degree in the CIEx map 831 as the CIEx value, e.g., 0.18. Similarly, the processor 404 can obtain the value corresponding to 0 degree in the CIEy map 832 as the CIEy value, e.g., 0.74. Next, the processor 404 can obtain a reference color 833a corresponding to the CIEx value (e.g., 0.18) and the CIEy value (e.g., 0.74) in the CIExy map 832 as the first color (which may be a green-ish color).

In addition, the processor 404 can determine the luminous intensity 840a (e.g., 0.9 candela (cd)) corresponding to 0 degree in the luminous intensity-to-field of view map 840 as the first luminous intensity.

Next, the processor 404 determines a specific color and a specific luminous intensity of the line 860a (i.e., the considered first image region) in the first reconstruction image 860 by respectively setting a color and a luminous intensity of the line 850a in the template image 850 to be the first color and the first luminous intensity. That is, the specific color of the line 860a would be the first color (e.g., the green-ish color), and the specific luminous intensity of the line 860a would be 0.9 ed.

Based on the above teachings, the color and the luminous intensity of other image regions (e.g., the image regions corresponding to the labels, separating lines, etc.) in the first reconstruction image 860 can be determined.

In this case, in response to the luminous intensity distribution in the luminous intensity-to-field of view map 840, the luminous intensity distribution in the first reconstruction image 860 can be accordingly determined.

For example, according to the luminous intensity-to-field of view map 840, the luminous intensities within the range of −10 degrees to 10 degrees (which corresponds to the range between the dotted lines) are relatively higher than the luminous intensities outside of this range. Therefore, the luminous intensities of the image regions within the range of −10 degrees to 10 degrees of the first reconstruction image 860 would be relatively higher (e.g., brighter) than the luminous intensities outside of this range.

In addition, based on the information provided by the CIEx map 831, the CIEy map 832, and the CIExy map 833, the colors of the image regions within the range of −10 degrees to 10 degrees of the first reconstruction image 860 would be green-ish colors, but the disclosure is not limited thereto.

Since the first the luminous intensity mask (e.g., the luminous intensity mask 732) is determined based on the characteristics of the considered light engine, the first reconstruction image 860 can be understood as a simulated visual effect provided by the display device (e.g., the AR glasses) when the first multiplexing grating corresponding to the diffraction response map 810 is used with the light engine. Therefore, the user can visually check whether the simulated visual effect corresponding to the first multiplexing grating satisfies the user's requirements.

In other embodiments, the processor 404 can further determine a second diffraction response map of a second multiplexing grating corresponding to a second grating combination of the grating combinations; determine a second luminous intensity map of the second multiplexing grating corresponding to the second grating combination via modifying the second diffraction response map based on the at least one parameter of the light engine; and determine a second reconstruction image corresponding to the light engine via processing the template image based on the second luminous intensity map.

In brief, the processor 404 can perform the same steps to other grating combination and obtain the corresponding reconstruction image, and the details can be referred to the above teachings.

Figure 9A:
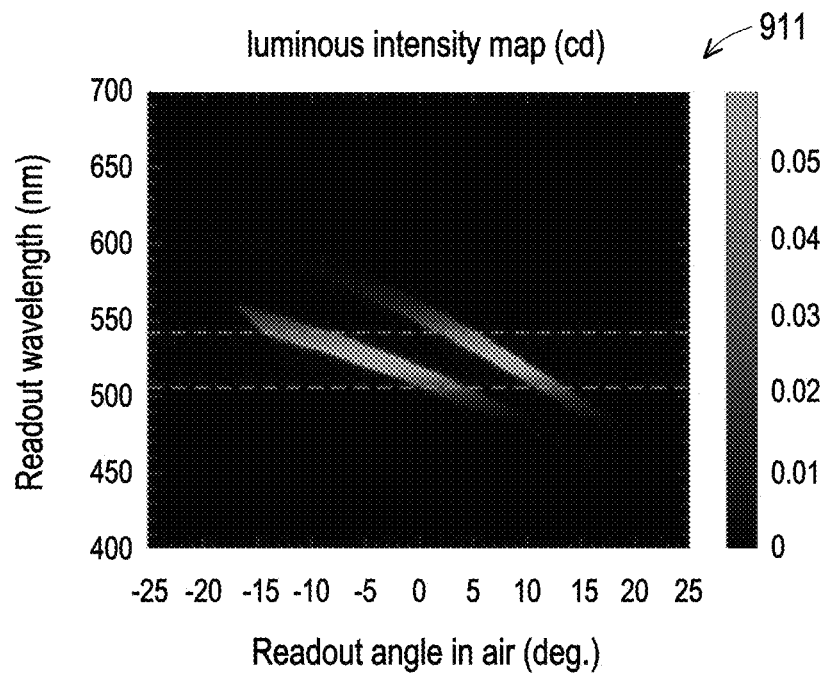
FIG. 9A and FIG. 9B show schematic diagrams of reconstruction images corresponding to different multiplexing gratings according to embodiments of the disclosure.
Figure 9A:
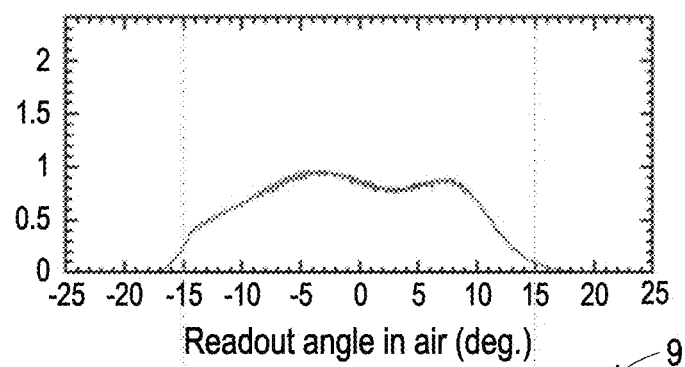
Figure 9A:
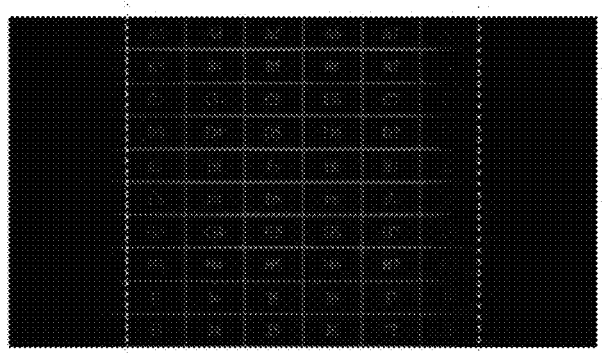
Figure 9B:
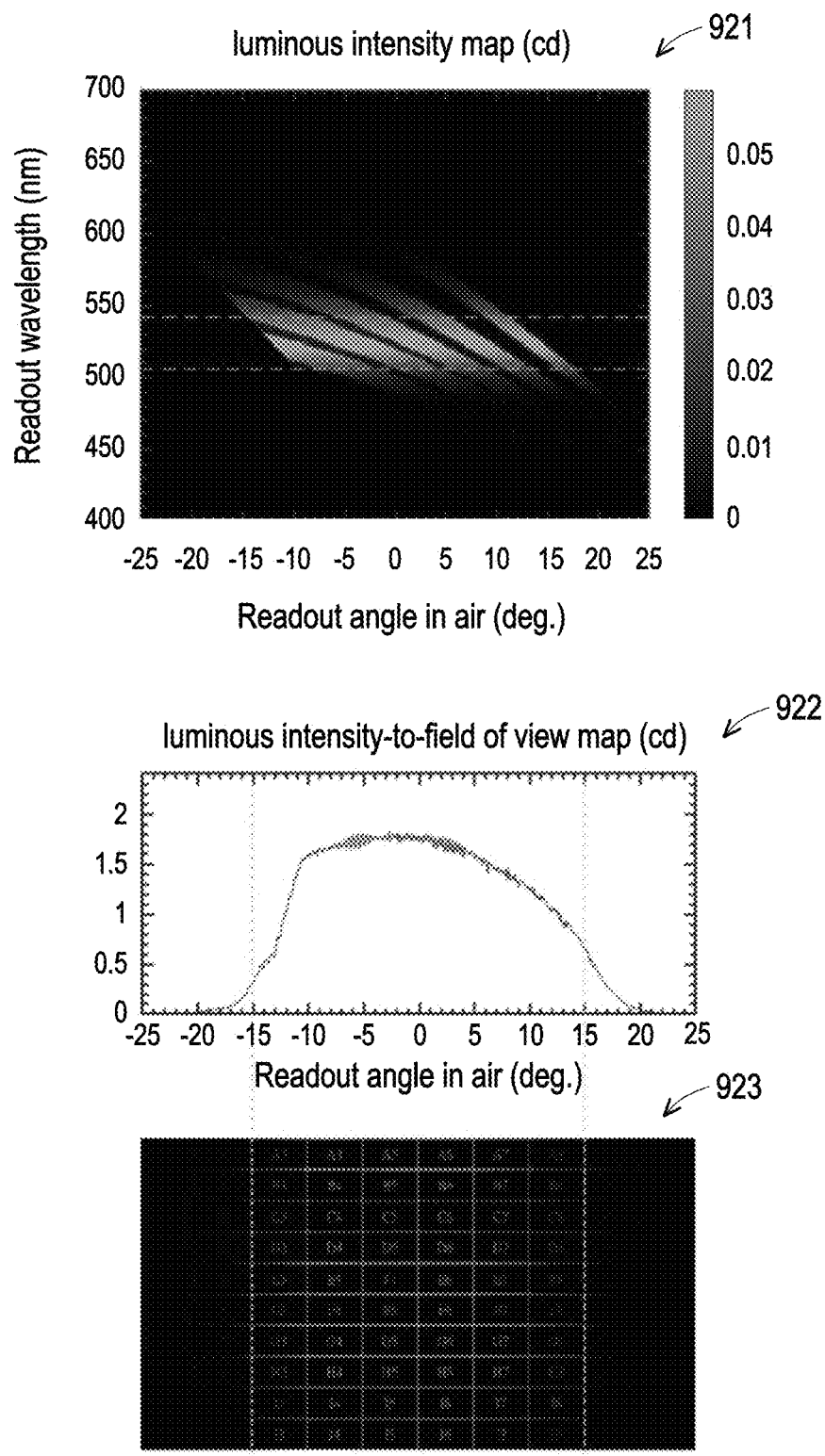

See FIG. 9A and FIG. 9B, wherein FIG. 9A and FIG. 9B show schematic diagrams of reconstruction images corresponding to different multiplexing gratings according to embodiments of the disclosure.

In FIG. 9A, based on the luminous intensity map 911 determined according to the considered multiplexing grating (referred to as MG1) and the light engine, the processor 404 can determine the corresponding luminous intensity-to-field of view map 912 and the corresponding reconstruction image 913.

In FIG. 9B, based on the luminous intensity map 921 determined according to another considered multiplexing grating (referred to as MG2) and the light engine, the processor 404 can determine the corresponding luminous intensity-to-field of view map 922 and the corresponding reconstruction image 923.

Accordingly, the user can visually check whether the simulated visual effect corresponding to these multiplexing gratings satisfy the user's requirements.

In addition, the processor 404 can further provide an estimated field of view of the first multiplexing grating formed on the display device corresponding to the light engine and provide a light engine usage rate of the first multiplexing grating used with the light engine. As such, the user can further determine whether the first multiplexing grating fits the user's requirements based on these data.

In FIG. 9A, the estimated field of view of MG1 may be about 31.0 degrees, and light engine usage rate of MG1 used with the light engine may be about 17.5%. In FIG. 9B, the estimated field of view of MG2 may be about 33.4 degrees, and light engine usage rate of MG2 used with the light engine may be about 37.53%.

Accordingly, the user can know that estimated field of view of MG2 is wider than MG1, and the light engine usage rate of MG2 is higher than MG1, but the disclosure is not limited thereto.

As mentioned in the above, the embodiments of the disclosure provide a solution for determining the candidate gratings, and the details thereof would be introduced in the following.

Figure 10:
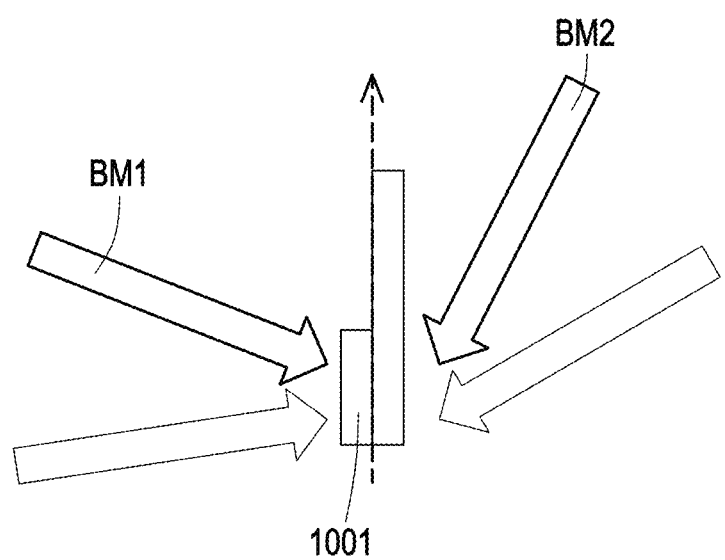
FIG. 10 shows a schematic diagram of fabricating a grating according to an embodiment of the disclosure.

See FIG. 10, which shows a schematic diagram of fabricating a grating according to an embodiment of the disclosure. In FIG. 10, when the grating fabricating equipment is fabricating a grating 1001 with a given surface period, the grating fabricating equipment would obtain a signal beam angle (referred to as BA2) of a signal beam BM2 when using a reference beam BM1 with a reference beam angle (referred to as BA1) to fabricate the grating 1001. That is, if the grating fabricating equipment is requested to produce the grating 1001 having the given surface period by using the reference beam BM1 with the reference beam angle BA1, the grating fabricating equipment needs to use the signal beam BM2 with the signal beam angle BA2 with the reference beam BM1 having the reference beam angle BA1.

From another perspective, for the grating fabricating equipment, once the reference beam angle BA1 of the reference beam BM1 and the surface period are given, the signal beam angle BA2 of the corresponding signal beam BM2 can be accordingly determined in a mathematical way.

However, even though some pairs of the reference beam BM1 and the signal beam BM2 may be used to fabricate a grating based on mathematical analysis, the grating fabricating equipment may not be able to practically perform the corresponding fabrication to produce the corresponding grating. In this case, this grating cannot be used as the candidate grating. See Table 1 for further discussions.

TABLE 1

| | Beam angle combination | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| BA1 | −32 | −28 | −24 | −20 | −16 | −12 | −8 | −4 | 0 | 4 | 8 | 10 | 12 | 16 |
| BA2 | −16.8 | −20.4 | −24.3 | −28.5 | −32.9 | −37.6 | −42.8 | −48.5 | −55.0 | −62.7 | −73.4 | −83.1 | −90.0 | −90.0 |
| Surface period (nm) | | | | | | | 427.27 | | | | | | | |
| Volume period (nm) | 176.5 | 175.3 | 175.0 | 175.4 | 176.9 | 179.5 | 183.4 | 189.1 | 197.3 | 209.5 | 230.8 | 254.5 | 270.7 | 263.1 |
| Slant angle | −24.4 | −24.2 | −24.1 | −24.2 | −24.4 | −24.8 | −25.4 | −26.2 | −27.5 | −29.3 | −32.7 | −36.5 | −39.0 | −37.0 |

In the scenario of Table 1, the reference beam angle BA1 has been determined to have 14 different values, and the signal beam angle BA2 are accordingly determined to have 14 different values. In this case, the processor 404 may accordingly determine 14 beam angle combination, wherein each beam angle combination comprises a reference beam angle and a signal beam angle, and a grating recorded by a reference beam and a signal beam respectively corresponding to the reference beam angle and the signal beam angle in each beam angle combination has a predetermined surface period (e.g., 427.27 nm), wherein the concept of the predetermined surface period can be referred to the descriptions of FIG. 2B.

Next, the processor 404 obtains at least one reference beam angle combination from the beam angle combinations and determines at least one of reference grating corresponding to the at least one reference beam angle combination as the candidate gratings.

In one embodiment, the reference beam angle and the signal beam angle in each of the reference beam angle combination is higher than −90 degrees and lower than 90 degrees. That is, if the reference beam angle or the signal beam angle in one of the beam angle combination is not lower than 90 degrees or not higher than −90 degrees, this beam angle combination would not be determined to be the reference beam angle combination, such that the corresponding grating would not be determined to be one of the candidate gratings. The reason is that it is impossible for the grating fabricating equipment to implement any beam angle not lower than 90 degrees or not higher than −90 degrees.

In Table 1 since the signal beam angle BA2 in each of the beam angle combination 13 and 14 is not higher than −90 degrees, the beam angle combination 13 and 14 would not be determined to be the reference beam angle combination. In this case, the gratings corresponding to the beam angle combination 13 and 14 would not be determined to be the candidate gratings.

In one embodiment, the processor 404 can further exclude some of the (remaining) beam angle combinations based on the following mechanism.

Specifically, in one embodiment, the processor 404 may sort the beam angle combinations 1-14 in an ascending order based on the reference beam angle BA1 in each beam angle combination 1-14, as shown in Table 1.

In a first case, in response to determining a specific parameter corresponding to an i-th beam angle combination is smaller than a specific parameter of an (i−1)-th beam angle combination and a specific parameter of an (i+1)-th beam angle combination, the processor 404 may determine that the i-th beam angle combination belongs to the at least one reference beam angle combination, wherein i is an index. In some embodiments, the specific parameter can be the volume period and/or the slant angle, but the disclosure is not limited thereto.

In Table 1, since the volume period of the beam angle combination 3 (i.e., i=3) is smaller than the volume period of the beam angle combination 2 and the volume period of the beam angle combination 4, the processor 404 may determine that the beam angle combination 3 belongs to the reference beam angle combinations. In this case, the grating corresponding to the beam angle combination 3 would be determined to be one of the candidate gratings.

In a second case, in response to determining the specific parameter corresponding to the i-th beam angle combination is not smaller than the specific parameter of the (i−1)-th beam angle combination and smaller than the specific parameter of an (i+1)-th beam angle combination, the processor 404 may determine that the i-th beam angle combination belongs to the at least one reference beam angle combination.

In Table 1, since the volume period of the beam angle combination 4 (i.e., i=4) is not smaller than the volume period of the beam angle combination 3 and smaller than the volume period of the beam angle combination 5, the processor 404 may determine that the beam angle combination 4 belongs to the reference beam angle combinations.

Based on the similar principle, the processor 404 may determine that each of the beam angle combination 5-12 belongs to the reference beam angle combinations. In this case, the grating corresponding to each of the beam angle combination 4-12 would be determined to be one of the candidate gratings.

In a third case, in response to determining the specific parameter corresponding to the i-th beam angle combination is smaller than the specific parameter of the (i−1)-th beam angle combination and not smaller than the specific parameter of an (i+1)-th beam angle combination, the processor determining that the i-th beam angle combination does not belong to the at least one reference beam angle combination In Table 1, since the volume period of the beam angle combination 2 (i.e., i=2) is smaller than the volume period of the beam angle combination 1 and not smaller than the volume period of the beam angle combination 3, the processor 404 may determine that the beam angle combination 2 does not belong to the reference beam angle combinations.

Since the processor 404 determines that the beam angle combination 2 as not belonging to the reference beam angle combinations, the processor 404 would also determine the beam angle combination 1 having a worse specific parameter than the beam angle combination 2 as not belonging to the reference beam angle combinations.

Accordingly, the gratings corresponding to the beam angle combinations 3-12 would be used as the candidate gratings for further analysis (e.g., used for performing steps S520-S550), but the disclosure is not limited thereto.

The disclosure further provides a computer readable storage medium for executing the analysing method for gratings. The computer readable storage medium is composed of a plurality of program instructions (for example, a setting program instruction and a deployment program instruction) embodied therein. These program instructions can be loaded into the electronic device 400 and executed by the same to execute the analysing method for gratings and the functions of the electronic device 400 described above.

In summary, the embodiments of the disclosure can reduce the complexity of analysing gratings by considering grating combinations. In addition, the embodiments of the disclosure can determine the luminous intensity map of each multiplexing grating corresponding to each grating combination via considering the diffraction response map thereof and the parameter (e.g., optical spectrums) of the light engine. Further, the embodiments of the disclosure can further process the template image based on the luminous intensity map to generate the reconstruction image, such that the user can visually check whether the simulated visual effect satisfies the user's requirements.

It will be apparent to those skilled in the art that various modifications and variations can be made to the structure of the present invention without departing from the scope or spirit of the disclosure. In view of the foregoing, it is intended that the present disclosure cover modifications and variations of this invention provided they fall within the scope of the following claims and their equivalents.

What is claimed is:

1. An analysing method for gratings, adapted to an electronic device, comprising:

determining a plurality of candidate gratings;

determining a plurality of grating combinations based on the candidate gratings, wherein each of the grating combinations comprises at least one of the candidate gratings, and the at least one of the candidate gratings in each grating combination is different from each other;

determining a first diffraction response map of a first multiplexing grating corresponding to a first grating combination of the grating combinations;

determining a first luminous intensity map of the first multiplexing grating corresponding to the first grating combination via modifying the first diffraction response map based on at least one parameter of a light engine; and determining a first reconstruction image corresponding to the light engine via processing a template image based on the first luminous intensity map.

2. The method according to claim 1, wherein the at least one parameter of the light engine comprises a first optical spectrum associated with a first color channel, and the step of determining the first luminous intensity map of the first multiplexing grating corresponding to the first grating combination via modifying the first diffraction response map based on the at least one parameter of the light engine comprises:

determining a luminous flux map via performing a unit conversion to the first optical spectrum;

determining a first luminous intensity mask associated with the first color channel via performing an angular expansion to the luminous flux map;

determining the first luminous intensity map of the first multiplexing grating corresponding to the first grating combination via combining the first luminous intensity mask with the first diffraction response map.

3. The method according to claim 2, wherein the step of combining the first luminous intensity mask with the first diffraction response map comprises:

multiplying the first luminous intensity mask with the first diffraction response map in a pointwise way.

4. The method according to claim 1, wherein the step of determining the first reconstruction image corresponding to the light engine via processing the template image based on the first luminous intensity map comprises:

determining a first color space map based on the first luminous intensity map;

determining a first luminous intensity-to-field of view map based on the first luminous intensity map; and determining the first reconstruction image via processing the template image with the first color space map and the first luminous intensity-to-field of view map.

5. The method according to claim 4, wherein each of the first reconstruction image and the template image comprises a first image region corresponding to a first viewing angle, and the step of processing the template image with the first color space map and the first luminous intensity-to-field of view map comprises:

determining a first color corresponding to the first viewing angle based on the first color space map;

determining a first luminous intensity corresponding to the first viewing angle based on the first luminous intensity-to-field of view map;

determining a specific color and a specific luminous intensity of the first image region in the first reconstruction image by respectively setting a color and a luminous intensity of the first image region in the template image to be the first color and the first luminous intensity.

6. The method according to claim 5, wherein the first color space map corresponds to a CIExy color space and comprises a CIEx map, a CIEy map, and a CIExy map, and the step of determining the first color corresponding to the first viewing angle based on the first color space map comprises:

obtaining a CIEx value corresponding to the first viewing angle in the CIEx map;

obtaining a CIEy value corresponding to the first viewing angle in the CIEy map; and obtaining a reference color corresponding to the CIEx value and the CIEy value in the CIExy map as the first color.

7. The method according to claim 1, further comprising:

providing an estimated field of view of the first multiplexing grating formed on a display device corresponding to the light engine; and providing a light engine usage rate of the first multiplexing grating used with the light engine.

8. The method according to claim 1, wherein the step of determining the candidate gratings comprises:

determining a plurality of beam angle combinations, wherein each beam angle combination comprises a reference beam angle and a signal beam angle, and a grating recorded by a reference beam and a signal beam respectively corresponding to the reference beam angle and the signal beam angle in each beam angle combination has a predetermined surface period;

obtaining at least one reference beam angle combination from the beam angle combinations;

determining at least one of reference grating corresponding to the at least one reference beam angle combination as the candidate gratings.

9. The method according to claim 8, wherein the reference beam angle and the signal beam angle in each of the reference beam angle combination is higher than −90 degrees and lower than 90 degrees.

10. The method according to claim 8, wherein the step of obtaining the at least one reference beam angle combination from the beam angle combinations comprises:

sorting the beam angle combinations in an ascending order based on the reference beam angle in each beam angle combination;

in response to determining a specific parameter corresponding to an i-th beam angle combination is smaller than a specific parameter of an (i−1)-th beam angle combination and a specific parameter of an (i+1)-th beam angle combination, determining that the i-th beam angle combination belongs to the at least one reference beam angle combination, wherein i is an index;

in response to determining the specific parameter corresponding to the i-th beam angle combination is not smaller than the specific parameter of the (i−1)-th beam angle combination and smaller than the specific parameter of an (i+1)-th beam angle combination, determining that the i-th beam angle combination belongs to the at least one reference beam angle combination.

11. The method according to claim 10, further comprising:

in response to determining the specific parameter corresponding to the i-th beam angle combination is smaller than the specific parameter of the (i−1)-th beam angle combination and not smaller than the specific parameter of an (i+1)-th beam angle combination, determining that the i-th beam angle combination does not belong to the at least one reference beam angle combination.

12. The method according to claim 1, wherein the first grating combination comprises a plurality of first gratings of the candidate gratings, and the first gratings are different from each other.

13. The method according to claim 1, wherein the grating combinations are different from each other.

14. The method according to claim 1, further comprising:

determining a second diffraction response map of a second multiplexing grating corresponding to a second grating combination of the grating combinations;

determining a second luminous intensity map of the second multiplexing grating corresponding to the second grating combination via modifying the second diffraction response map based on the at least one parameter of the light engine; and determining a second reconstruction image corresponding to the light engine via processing the template image based on the second luminous intensity map.

15. The method according to claim 1, wherein the step of determining the first diffraction response map of the first multiplexing grating corresponding to the first grating combination comprises:

determining the first diffraction response map of the first grating combination by analysing the first grating combination with a Kogelnik theoretical model.

16. An electronic device, comprising:

a non-transitory storage circuit, storing a program code;

a processor, coupled to the non-transitory storage circuit and accessing the program code to perform:

determining a plurality of candidate gratings;

determining a plurality of grating combinations based on the candidate gratings, wherein each of the grating combinations comprises at least one of the candidate gratings, and the at least one of the candidate gratings in each grating combination is different from each other;

determining a first diffraction response map of a first grating combination of the grating combinations;

determining a first luminous intensity map of the first multiplexing grating corresponding to the first grating combination via modifying the first diffraction response map based on at least one parameter of a light engine; and determining a first reconstruction image corresponding to the light engine via processing a template image based on the first luminous intensity map.

17. The electronic device according to claim 16, wherein the at least one parameter of the light engine comprises a first optical spectrum associated with a first color channel, and the processor performs:

determining a luminous flux map via performing a unit conversion to the first optical spectrum;

determining a first luminous intensity mask associated with the first color channel via performing an angular expansion to the luminous flux map;

determining the first luminous intensity map of the first multiplexing grating corresponding to the first grating combination via combining the first luminous intensity mask with the first diffraction response map.

18. The electronic device according to claim 16, wherein the processor performs:

determining a first color space map based on the first luminous intensity map;

determining a first luminous intensity-to-field of view map based on the first luminous intensity map; and determining the first reconstruction image via processing the template image with the first color space map and the first luminous intensity-to-field of view map.

19. The electronic device according to claim 16, wherein the processor performs:

determining a plurality of recording beam angle combinations, wherein each recording beam angle combination comprises a reference recording beam angle and a signal recording beam angle, and a grating recorded by a reference recording beam and a signal recording beam respectively corresponding to the reference recording beam angle and the signal recording beam angle in each recording beam angle combination has a predetermined surface period;

obtaining at least one reference beam angle combination from the recording beam angle combinations;

determining at least one of reference grating corresponding to the at least one reference beam angle combination as the candidate gratings.

20. A non-transitory computer readable storage medium, the computer readable storage medium recording an executable computer program, the executable computer program being loaded by a host to perform steps of:

determining a plurality of candidate gratings;

determining a plurality of grating combinations based on the candidate gratings, wherein each of the grating combinations comprises at least one of the candidate gratings, and the at least one of the candidate gratings in each grating combination is different from each other;

determining a first diffraction response map of a first multiplexing grating corresponding to a first grating combination of the grating combinations;

determining a first luminous intensity map of the first multiplexing grating corresponding to the first grating combination via modifying the first diffraction response map based on at least one parameter of a light engine; and determining a first reconstruction image corresponding to the light engine via processing a template image based on the first luminous intensity map.

* * * * *